United States Patent
Hyun et al.

(10) Patent No.: US 8,183,141 B2
(45) Date of Patent: May 22, 2012

(54) METHODS OF FORMING SEMICONDUCTOR DEVICES

(75) Inventors: Sangjin Hyun, Gyeonggi-do (KR);
Siyoung Choi, Gyeonggi-do (KR);
Yugyun Shin, Gyeonggi-do (KR);
Kang-Ill Seo, Gyeonggi-do (KR); Hagju Cho, Gyeonggi-do (KR); Hoonjoo Na, Gyeonggi-do (KR); Hyosan Lee, Gyeonggi-do (KR); Jun-Woong Park, Gyeonggi-do (KR); Hye-Lan Lee, Gyeonggi-do (KR); Hyung-Seok Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 303 days.

(21) Appl. No.: 12/581,223

(22) Filed: Oct. 19, 2009

(65) Prior Publication Data

US 2010/0099245 A1  Apr. 22, 2010

(30) Foreign Application Priority Data

Oct. 21, 2008 (KR) .................. 10-2008-0103197

(51) Int. Cl.
*H01L 21/3205* (2006.01)
*H01L 21/4763* (2006.01)
*H01L 21/00* (2006.01)
*H01L 21/16* (2006.01)

(52) U.S. Cl. ............ 438/591; 438/104; 438/85; 438/86
(58) Field of Classification Search ............... 438/592, 438/585, 594, 308, 509, 584, 722, 761, 785, 438/240, 104, 85, 86, 754, 502
See application file for complete search history.

(56) References Cited

U.S. PATENT DOCUMENTS

| 6,897,095 B1 | 5/2005 | Adetutu et al. |
| 7,344,934 B2 | 3/2008 | Li |
| 2006/0170017 A1* | 8/2006 | Muraoka ............ 257/288 |

FOREIGN PATENT DOCUMENTS

| JP | 2007-123662 | 5/2007 |
| KR | 1020020001145 A | 1/2002 |
| KR | 1020070037124 A | 4/2007 |

OTHER PUBLICATIONS

Dean, John A., Lange's Handbook of Chemistry, 12th ed.; McGraw-Hill Book Company: New York, NY, 1979; pp. 9:4-9:94.*

* cited by examiner

*Primary Examiner* — Chuong A. Luu
(74) *Attorney, Agent, or Firm* — Myers Bigel Sibley & Sajovec, P.A.

(57) ABSTRACT

Provided are a semiconductor device and a method of forming the same. The method may include forming a metal oxide layer on a substrate and forming a sacrificial oxide layer on the metal oxide layer. An annealing process is performed on the substrate. A formation-free energy of the sacrificial oxide layer is greater than a formation-free energy of the metal oxide layer at a process temperature of the annealing process.

16 Claims, 8 Drawing Sheets

METHODS OF FORMING SEMICONDUCTOR DEVICES

REFERENCE TO PRIORITY APPLICATION

This U.S. patent application claims priority to Korean Patent Application No. 10-2008-0103197, filed Oct. 21, 2008, the contents of which are hereby incorporated herein by reference.

FIELD OF THE INVENTION

The embodiments disclosed herein relate to semiconductor devices and methods of forming the same and, more particularly, to semiconductor devices including dielectric layers and methods of forming the same.

BACKGROUND

As a semiconductor industry is highly developed, a high integration of a semiconductor device is deepened. That is, a minimum line width and thickness of layers (e.g., a conductive layer and/or a dielectric layer) of a semiconductor device becomes increasingly minute. A lot of problems may occur due to a miniature of a semiconductor device. For example, degradation of an operation speed, an increase of power consumption and/or degradation of reliability may occur. In contrast, user's requirements for an improvement of various characteristics (e.g., high speed, low power consumption and/or high reliability) of a semiconductor device are increased more and more. A lot of studies of a semiconductor device are being performed to meet the miniature and user's requirements.

SUMMARY

Exemplary embodiments provide a method of forming a semiconductor device. The method may include forming a metal oxide layer on a substrate; forming a sacrificial oxide layer on the metal oxide layer; and performing an annealing process on the substrate including the sacrificial oxide layer. A formation-free energy of the sacrificial oxide layer is greater than a formation-free energy of the metal oxide layer at a process temperature of the annealing process.

Exemplary embodiments provide a semiconductor device. The semiconductor device may include a substrate; and a metal oxide layer disposed on the substrate, the metal oxide layer including a specific element and at least one metal element, wherein reactivity between the specific element and oxygen is smaller than reactivity between the metal element and oxygen.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

First Embodiment

Figure 1:
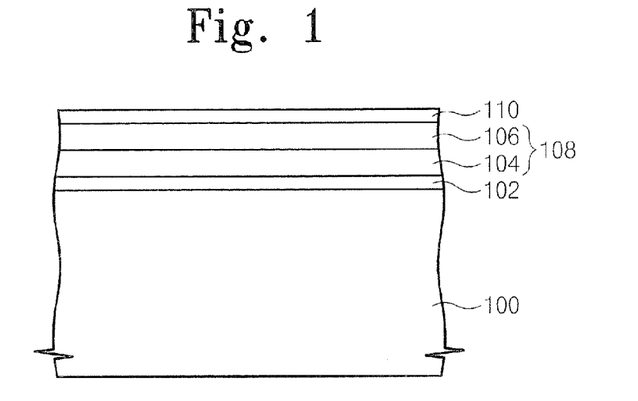
FIGS. 1 through 3 are cross-sectional views illustrating a method of forming a semiconductor device according to an embodiment of the present invention.
Figure 2:
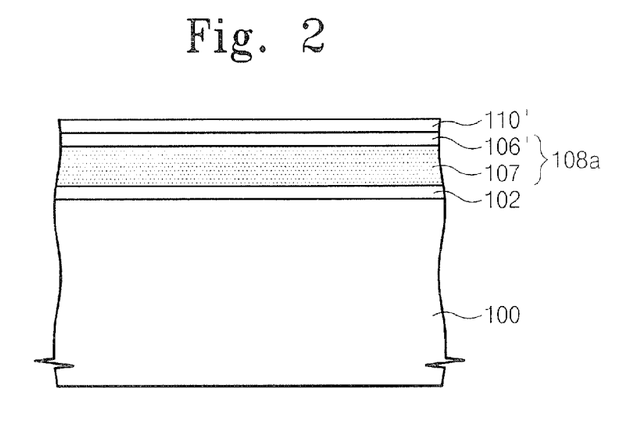
Figure 3:
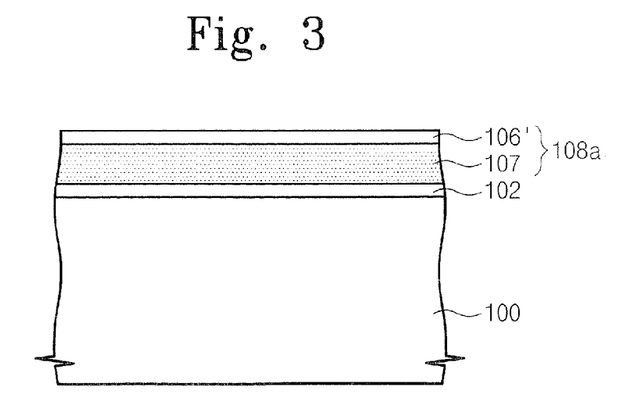

FIGS. 1 through 3 are cross-sectional views illustrating a method of forming a semiconductor device according to an embodiment of the present invention.

Referring to FIG. 1, an interface layer 102 may be formed on a substrate 100. A metal oxide layer 108 may be formed on the interface layer 102. The substrate 100 may include a semiconductor layer. The semiconductor layer may be a portion (e.g., an upper portion) of a semiconductor substrate. Unlike this, the semiconductor layer may be disposed on an insulating layer on a semiconductor substrate. The semiconductor layer may include silicon, germanium or silicon-germanium. However, the present invention is not limited to here. In an embodiment, the substrate 100 may include a conductor used as an electrode disposed on a semiconductor substrate.

The interface layer 102 may perform a function of inhibiting a reaction between the metal oxide layer 108 and the substrate 100. The interface layer 102 may include an oxide layer, an oxynitride layer and/or a nitride layer. In the case that the semiconductor layer of the substrate 100 includes silicon, the interface layer 102 may include a silicon oxide layer by a thermal oxidation process, a silicon oxynitride layer by a thermal oxidation process and a nitration process, and/or a silicon nitride layer by a nitration process. Since the interface layer 102 is formed by a thermal oxidation process and/or a thermal oxidation process, the interface layer 102 may have a very dense structure. The interface layer 102 may be omitted.

The metal oxide layer 108 may have a dielectric constant higher than that of a silicon oxide layer. The metal oxide layer 108 may be single-layered or multi-layered. For example, the metal oxide layer 108 may include a first metal oxide layer 104 and a second metal oxide layer 106 that are sequentially stacked. That is, the first metal oxide layer 104 may be formed on the interface layer 102 and the second metal oxide layer 106 may be formed on the first metal oxide layer 104. As described above, the first and second metal oxide layers 104 and 106 may have a dielectric constant higher than that of a silicon oxide layer. The first metal oxide layer 104 may include a first metal element and oxygen and the second metal oxide layer 106 may include a second metal element and oxygen. The first and second metal elements may be different from each other. The metal oxide layer 108 may include at least one selected from the group consisting of a hafnium oxide layer ($HfO_2$), a lanthanum oxide layer ($La_2O_3$), a zirconium oxide layer ($ZrO_2$), a dysprosium oxide layer ($Dy_2O_3$), an yttrium oxide layer ($Y_2O_3$), an aluminum oxide layer ($Al_2O_3$), a scandium oxide layer ($Sc_2O_3$) and an erbium oxide layer ($Er_2O_3$). The first and second metal oxides 104 and 106 may be formed of different metal oxide from each other.

A sacrificial oxide layer 110 is formed on the metal oxide layer 108. The sacrificial oxide layer 110 may include a specific element and oxygen. The sacrificial oxide layer 110 may be formed by using a process such as a chemical vapor deposition (CVD) process and/or an atomic layer deposition (ALD) process. The sacrificial oxide layer 110 may be formed under a process temperature lower than a minimum temperature required when elements in the metal oxide layer 108 are activated. Accordingly, when the sacrificial oxide layer 110 is formed, elements in the metal oxide layer 108 may not be activated.

Referring to FIG. 2, an annealing process is performed on the substrate 100 including the sacrificial oxide layer 110 and the metal oxide layer 108. A process temperature of the annealing process may be equal to or greater than a minimum temperature required when elements (e.g., the first metal element, the second metal element, the specific element and oxygen) in the sacrificial oxide layer 110 and the metal oxide layer 108 are activated. The process temperature of the annealing process may be from about 600° C. to about 1100° C. A process gas of the annealing process may include an inert gas (e.g., nitrogen gas ($N_2$) or argon gas).

Each of the metal oxide layer 108 and the sacrificial oxide layer 110 has Gibbs free energy of formation. Hereinafter, the Gibbs free energy of formation is referred as formation-free energy. The formation-free energy is a thermodynamic quantity representing a degree of spontaneity of a reaction. At the process temperature of the annealing process, the formation-free energy of the sacrificial oxide layer 110 may be greater than the formation-free energy of the metal oxide layer 108. Accordingly, when the annealing process is performed, reactivity between oxygen and the specific element in the sacrificial oxide layer 110 is smaller than reactivity between oxygen and metal elements in the metal oxide layer 108. The formation-free energy of the sacrificial oxide layer 110 and the formation-free energy of the metal oxide layer 108 may be a negative number. That is, the sacrificial oxide layer 110 and the metal oxide layer 108 may be material generated from a spontaneous reaction.

Since the formation-free energy of the sacrificial oxide layer 110 is greater than the formation-free energy of the metal oxide layer 108 at the process temperature of the annealing process, oxygen in the sacrificial oxide layer 110 may be supplied to the metal oxide layer 108 during the annealing process. More specifically, the specific element and oxygen in the sacrificial oxide layer 110 and the metal elements and oxygen in the metal oxide layer 108 are activated during the annealing process. At this time, oxygen in the sacrificial oxide layer 110 may be combined with the metal elements having a strong reactivity in the metal oxide layer 108 during the annealing process. That is, oxygen in the sacrificial oxide layer 110 may be supplied to the metal oxide layer 108. The supplied oxygen may be combined with vacancies in the annealed metal oxide layer 108a. As a result, vacancies in the annealed metal oxide layer 108a can be minimized. When the metal oxide layer 108 is a single layer, bulk vacancies in the annealed metal oxide layer 108a can be minimized by the sacrificial oxide layer 110 and the annealing process. The annealed sacrificial oxide layer 110' may be in an oxygen-lacked state.

Next, the case that the metal oxide layer 108 includes the first metal oxide layer 104 and the second metal oxide layer 106 will be described in detail. The formation-free energy of the sacrificial oxide layer 110 may be greater than a formation-free energy of the first metal oxide layer 104 and a formation-free energy of the second metal oxide layer 106 at the process temperature of the annealing process. The process temperature of the annealing process may be equal to or greater than a minimum temperature required when the first metal element and oxygen of the first metal oxide layer 104, the second metal element and oxygen of the second metal oxide layer 106 and the specific element and oxygen of the sacrificial oxide layer 110 are activated. The formation-free energy of the first metal oxide layer 104 and the formation-free energy of the second metal oxide layer 106 may be different from each other. The first metal oxide layer 104 and the second metal oxide layer 106 may be combined with each other by the annealing process to generate a combination layer 107. That is, the annealed metal oxide layer 108a may include the combination layer 107. The combination layer 107 may include the first metal element, the second metal element and oxygen. Since the formation-free energy of the first metal oxide layer 104 and the formation-free energy of the second metal oxide layer 106 are different from each other, not only bulk vacancies but also vacancies generated by a combination may exist in the combination layer 107. At this time, oxygen in the sacrificial oxide layer 110 is supplied to the combination layer 107 to minimize vacancies in the combination layer 107.

For example, the sacrificial oxide layer 110 may include at least one selected from the group consisting of a silicon oxide layer ($SiO_2$), a magnesium oxide layer (MgO), a calcium oxide layer (CaO), a beryllium oxide layer (BeO), a nickel oxide layer (NiO), a lithium oxide layer (LiO) and a germanium oxide layer ($GeO_2$ or GeO).

For example, the first metal oxide layer 104 may be formed of a hafnium oxide layer ($HfO_2$) and the second metal oxide layer 106 may be formed of an aluminum oxide layer ($Al_2O_3$). In this case, the sacrificial oxide layer 110 may be formed of a silicon oxide layer ($SiO_2$). A formation-free energy of a hafnium oxide layer ($HfO_2$) is about −1217 KJ/mol at about 950° C., a formation-free energy of an aluminum oxide layer ($Al_2O_3$) is about −1738 KJ/mol at about 950° C. and a formation-free energy of a silicon oxide layer ($SiO_2$) is −962 KJ/mol at about 950° C. That is, a formation-free energy of the sacrificial oxide layer 110 formed of a silicon oxide layer ($SiO_2$) is greater than formation-free energies of the first and second metal oxide layers 104 and 106 respectively formed of a hafnium oxide layer ($HfO_2$) and an aluminum oxide layer ($Al_2O_3$).

As depicted in FIG. 2, a portion of the second metal oxide layer 106 may be combined with the first metal oxide layer 104 by the annealing process. In this case, a remaining layer 106' of the second metal oxide layer may be disposed on the combination layer 107. The annealed metal oxide layer 108a may include the combination layer 107 and the remaining layer 106' of the second metal oxide layer. The remaining layer 106' may include the second metal element and oxygen. Oxygen in the sacrificial oxide layer 110 is also supplied to the remaining layer 106'. Accordingly, even when the formation-free energy of the second metal oxide layer 106 is greater than the formation-free energy of the first metal oxide layer 104, vacancies of the remaining layer 106' may be minimized by oxygen in the sacrificial oxide layer 110. Unlike this, an entire portion of the second metal oxide layer 106 may be combined with the first metal oxide layer 104. In this case, the remaining layer 106' is not formed and the annealed metal oxide layer 108a may include the combination layer 107.

Referring to FIG. 3, the annealed sacrificial oxide layer 110' is removed. According to an embodiment, the annealed sacrificial oxide layer 110' and the remaining layer 106' may be removed after performing the annealing process, such that the annealed metal oxide layer 108a may include the combination layer 107. According to an embodiment, after removing the annealed sacrificial oxide layer 110', the annealed metal oxide layer 108a may include the specific element of the sacrificial oxide layer 110.

Figure 4:
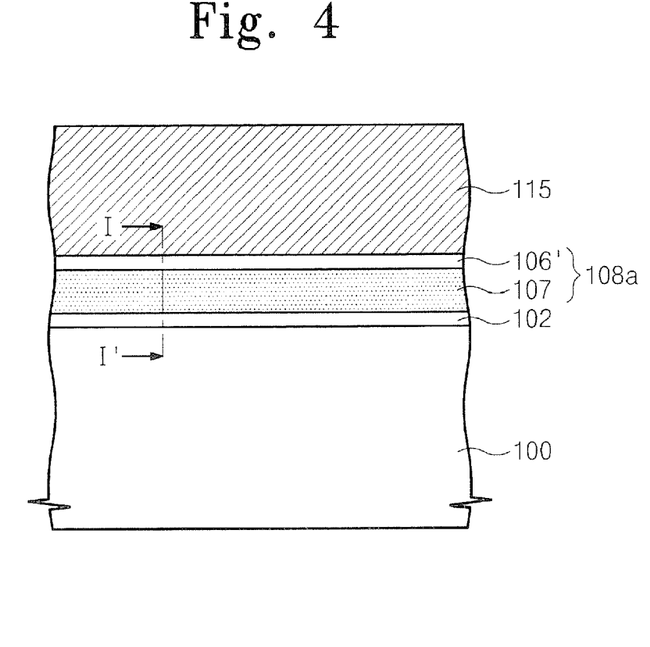
FIG. 4 is a cross-sectional view of a semiconductor device according to an embodiment of the present invention.

After removing the annealed sacrificial oxide layer 110', an electrode 115 of FIG. 4 may be formed on the substrate 100. The electrode 115 may be formed on the annealed metal oxide layer 108a. The electrode 115 may be directly formed on the combination layer 107 or on the remaining layer 106'. The combination layer 107 may shift a Fermi-level of the electrode 115 of FIG. 4. Thus, an effective work function of the electrode 115 may be changed. Further details of the effective work function of the electrode 115 will be described later referring to FIG. 4. The annealed metal oxide layer 108a may be used as a dielectric layer of various uses. For example, the annealed metal oxide layer 108a may be used as a gate dielectric layer of a transistor or a capacitor dielectric layer of a capacitor.

According to the method of forming a semiconductor device described above, oxygen in the sacrificial oxide layer 110 is supplied to the metal oxide layer 108 during the annealing process. Accordingly, vacancies in the annealed metal oxide layer 108a can be minimized. As a result, an electrical characteristic of the annealed metal oxide layer 108a may be improved.

Vacancies in a dielectric layer may cause some problems. For example, the vacancies in the dielectric layer may trap charges. Thus, an electric potential of the dielectric layer having the vacancies may be changed to cause a deterioration of a characteristic of a semiconductor device. Also, charges may penetrate the dielectric layer via the vacancies in the dielectric layer. Accordingly, a characteristic of a leakage current of the dielectric layer may be deteriorated. In addition, when the dielectric layer having the vacancies is used as a gate dielectric layer, the vacancies may decrease a mobility of carries in a channel. However, according to an embodiment of the present invention, vacancies in the annealed metal oxide layer 108a are minimized by the sacrificial oxide layer 110 and the annealing process. Thus, a dielectric layer including the annealed metal oxide layer 108a having a superior electrical characteristic can be embodied.

Oxygen in the sacrificial oxide layer 110 can be diffused into the metal oxide layer 108 by performing the annealing process after forming the sacrificial oxide layer 110. Thus, oxygen in the sacrificial oxide layer 110 can be stably supplied to the metal oxide layer 108. As a result, an effect that oxygen in the sacrificial oxide layer 110 applies to a substrate under the metal oxide layer 108 can be minimized.

FIG. 4 is a cross-sectional view of a semiconductor device according to an embodiment of the present invention.

Referring to FIG. 4, a metal oxide layer 108a is disposed on a substrate 100. An interface layer 102 may be disposed between the metal oxide layer 108a and the substrate 100. The interface layer 102 may include oxide, nitride and/or oxynitride. The interface layer 102 may be omitted. An electrode 115 may be disposed on the metal oxide layer 108a. The electrode 115 may include at least one selected from the group consisting of a doped semiconductor, a conductive metal nitride (e.g., titanium nitride or tantalum nitride), metal silicide (e.g., tungsten silicide or cobalt silicide) and metal (e.g., titanium, tantalum, copper, aluminum or noble metal).

The metal oxide layer 108a may include oxygen and at least one metal element. In addition, the metal oxide layer 108a may include a specific element. Reactivity between the specific element and oxygen may be smaller than reactivity between the metal element and oxygen. In other words, a reduction potential of the specific element may be smaller than a reduction potential of the metal element. According to an embodiment of the present invention, the metal oxide layer 108a may include a first metal element, a second metal element, oxygen and the specific element. In this case, the reactivity between the specific element and oxygen may be smaller than reactivity between the first metal element and oxygen and reactivity between the second metal element and oxygen. That is, a reduction potential of the specific element may be smaller than a reduction potential of the first metal element and a reduction potential of the second metal element. The first metal element may be a metal element included in the first metal oxide layer 104 of FIG. 1 and the second metal element may be a metal element included in the second metal oxide layer 106 of FIG. 1.

The metal oxide layer 108a may include a combination layer 107 including the first metal element, the second metal element and oxygen, and a capping layer 106' disposed on the combination layer 107. The capping layer 106' may include the second metal element and oxygen. The capping layer 106' may not include the first metal element. The capping layer 106' may correspond to the remaining layer 106' of FIG. 2. Unlike this, the metal oxide layer 108a may be composed of only the combination layer 107 without the capping layer 106'.

A concentration of the specific element in the metal oxide layer 108a may be different depending on a location of the metal oxide layer 108a.

Figure 5:
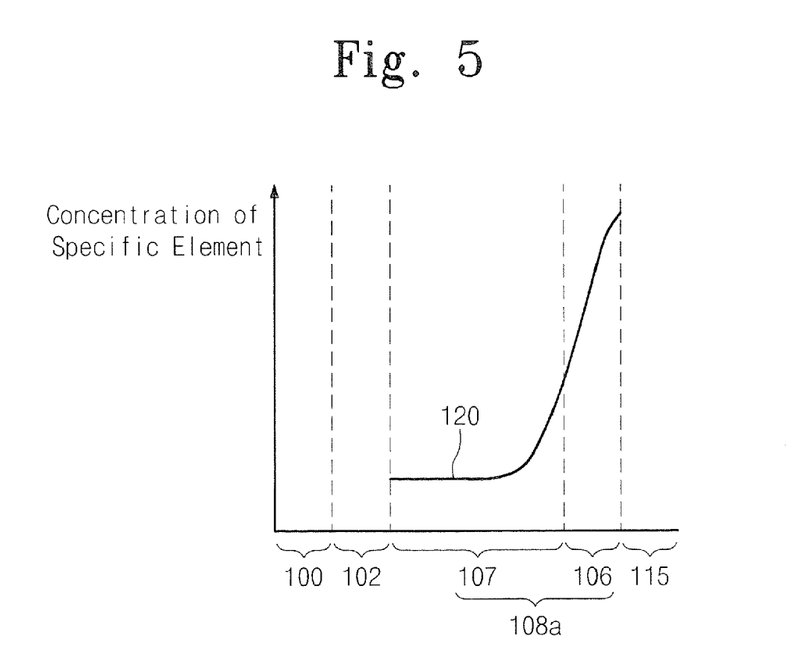
FIG. 5 is a graph illustrating a specific element concentration in a metal oxide layer of a semiconductor device according to an embodiment of the present invention, the graph being taken along the line I-I' of FIG. 4.

FIG. 5 is a graph illustrating a specific element concentration in a metal oxide layer of a semiconductor device according to an embodiment of the present invention, the graph being taken along the line I-I' of FIG. 4.

Referring to FIGS. 4 and 5, a y axis represents a concentration of the specific element and an x axis represents a location in FIG. 5. The metal oxide layer 108a has first surface and second surface facing each other. The first surface of the metal oxide layer 108a is disposed to be relatively away from the removed sacrificial oxide layer (110' of FIG. 2) compared with the second surface. The second surface of the metal oxide layer 108a is disposed to be relatively close to the removed sacrificial oxide layer (110' of FIG. 2) compared with the first surface. For example, the first surface of the metal oxide layer 108a may correspond to a lower surface of the metal oxide layer 108a and the second surface of the metal oxide layer 108a may correspond to an upper surface of the metal oxide layer 108a. In FIG. 5, the first surface of the metal oxide layer 108a is adjacent to the interface layer 102 and the second surface of the metal oxide layer 108a is adjacent to the electrode 115. When the metal oxide layer 108a includes the combination layer 107 and the capping layer 106', the second surface of the metal oxide layer 108a may correspond to an upper surface of the capping layer 106'. When the metal oxide layer 108a include only the combination layer 107, the second surface of the metal oxide layer 108a may correspond to an upper surface of the combination layer 107.

A line 120 of FIG. 5 represents a concentration of the specific element. As depicted in FIG. 5, a concentration of the specific element of a portion of the metal oxide layer 108a adjacent to the first surface is different from a concentration of the specific element of a portion of the metal oxide layer 108a adjacent to the second surface. The concentration of the specific element of the portion of the metal oxide layer 108a adjacent to the second surface may be greater than the concentration of the specific element of the portion of the metal oxide layer 108a adjacent to the first surface. The portion of the metal oxide layer 108a adjacent to the second surface may have a significant concentration of the specific element. As a location in the metal oxide layer 108a moves from the second surface toward the first surface, the concentration of the specific element may be abruptly decreased.

the concentration of the specific element is very small compared with a concentration of the metal element in the metal oxide layer 108a. For example, a maximum value of a concentration of the specific element may be $10^{-5}$% to several % of a concentration of the metal element in the metal oxide layer 108a.

The metal oxide layer 108a including the combination layer 107 may shift a Fermi level of the electrode 115.

Figure 6:
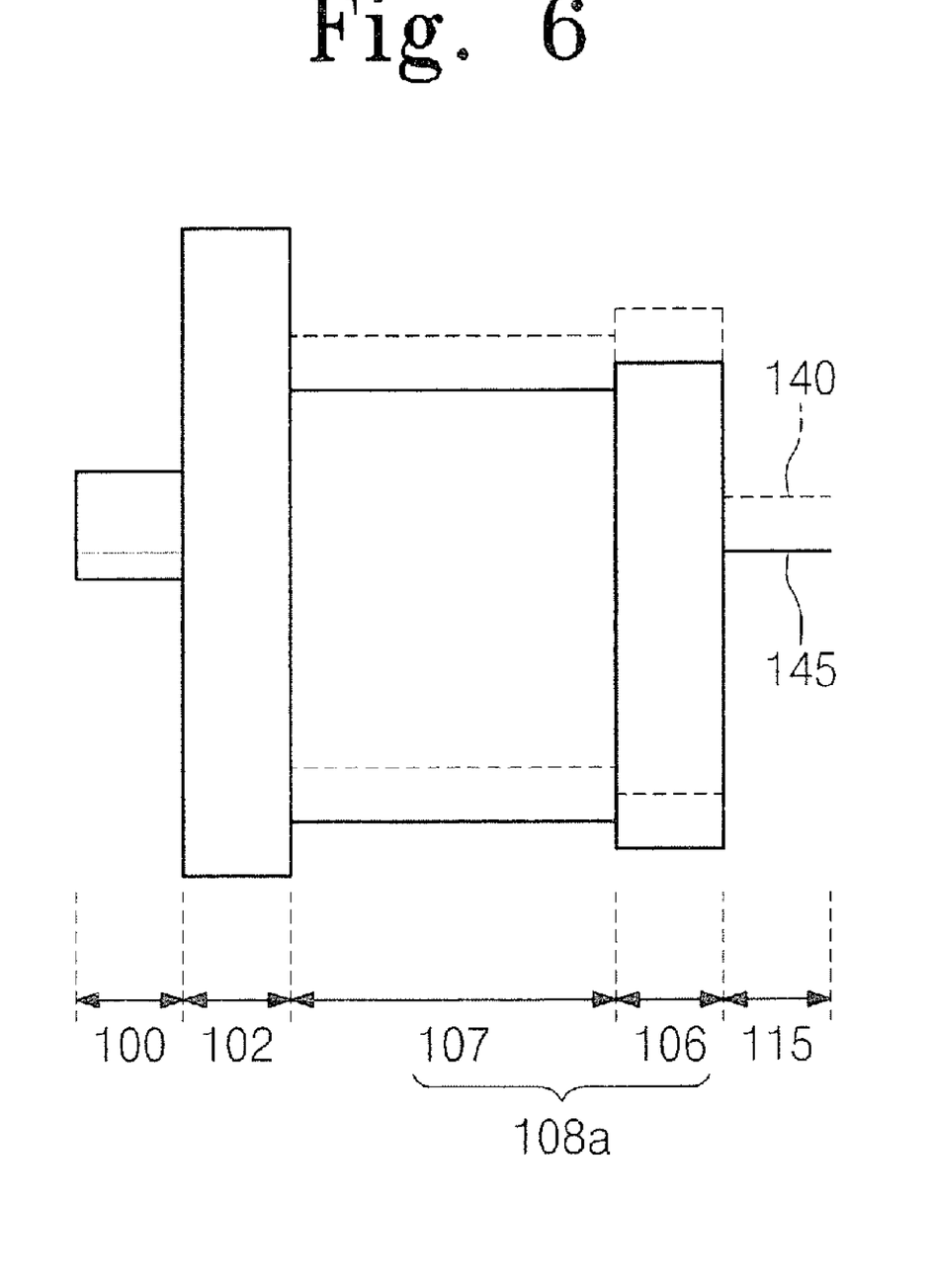
FIG. 6 is an energy band diagram of a semiconductor device according to an embodiment of the present invention, the energy band diagram being taken along the line I-I' of FIG. 4.

FIG. 6 is an energy band diagram of a semiconductor device according to an embodiment of the present invention, the energy band diagram being taken along the line I-I' of FIG. 4. An energy band diagram of FIG. 6 is a simplified thing for convenience of an explanation.

Referring to FIGS. 4 and 6, the combination layer 107 includes first surface and second surface facing each other. A first interface may be formed by the first surface of the combination layer 107 and the interface layer 102. When the interface layer 102 is omitted, the first interface may be formed by the first surface of the combination layer 107 and the substrate 100. A second interface may be formed by the second surface of the combination layer 107 and the capping layer 106'. When the capping layer 106' is omitted, the second interface may be formed by the second surface of the combination layer 107 and the electrode 115.

The combination layer 107 may change an interface state of the first interface. Thus, a band offset between the combination layer 107 and the interface layer 102 may be changed. The band offset may be defined by an energy difference between conduction band edges of two layers that are in contact with each other. The band offset between the combination layer 107 and the interface layer 102 is an energy difference between a conduction band edge of the combination layer 107 and a conduction band edge of the interface layer 102.

As the band offset between the combination layer 107 and the interface layer 102 is changed, a Fermi level of the electrode 115 may be shifted. In FIG. 6, a reference numeral 140 is a natural Fermi level of the electrode 115 and a reference numeral 145 of FIG. 6 represents a shifted Fermi level of the electrode 115. A dotted line of the metal oxide layer 108a in FIG. 6 represents natural energy bands of the combination layer 107 and the capping layer 106'.

The combination layer 107 changes an interface state of the second interface, thereby changing a band offset between the combination layer 107 and the capping layer 106' (or the electrode 115). In this case, a band offset variation at the second interface may be different from a band offset variation at the first interface. Band offset variations of the first and second interfaces may be a positive number or a negative number. When the band offset variation is a negative number, the shifted band offset is decreased compared with the natural band offset. When the band offset variation is a positive number, the shifted band offset is increased compared with the natural band offset. Accordingly, a Fermi level of the electrode 115 may be shifted by a band offset variation due to the combination layer 107. A portion of the combination layer 107 adjacent to the first surface of the combination layer 107 and a portion of combination layer 107 adjacent to the second surface of the combination layer 107 may have a different content ratio from each other. In other words, a first metal element concentration and a second metal element concentration of the portion of the combination layer 107 adjacent to the first surface may be different from a first metal element concentration and a second metal element concentration of the portion of the combination layer 107 adjacent to the second surface, respectively.

The Fermi level of the electrode 115 may be increased by the combination layer 107. For example, when one of the first and second metal elements in the combination layer 107 is aluminum, a Fermi level of the electrode 115 may be increased. In this case, an aluminum concentration in the portion of the combination layer 107 adjacent to the first surface of the combination layer 107 may be greater than an aluminum concentration in the portion of the combination layer 107 adjacent to the second surface of the combination layer 107. In this case, the other of the first and second metal elements in the combination layer 107 may be hafnium.

A Fermi level of the electrode 115 may be decreased by the combination layer 107. For example, when one of the first and second metal elements in the combination layer 107 is one of zirconium and rare-earth metal (e.g., lanthanum (La), dysprosium (Dy) or erbium (Er)), a Fermi level of the electrode 115 may be decreased. In this case, a zirconium concentration (or rare-earth metal concentration) in the portion of the combination layer 107 adjacent to the first surface of the combination 107 may be greater than a zirconium concentration (or rare-earth metal concentration) in the portion of the combination layer 107 adjacent to the second surface of the combination 107.

Second Embodiment

The present embodiment discloses a semiconductor device including transistors according to an embodiment of the present invention. In particular, the present embodiment discloses a semiconductor device including an NMOS transistor and a PMOS transistor. In the present embodiment, elements identical to the first embodiment described above use like reference numerals.

FIGS. 7 through 10 are cross-sectional views illustrating a method of forming a semiconductor device according to another embodiment of the present invention.

Figure 7:
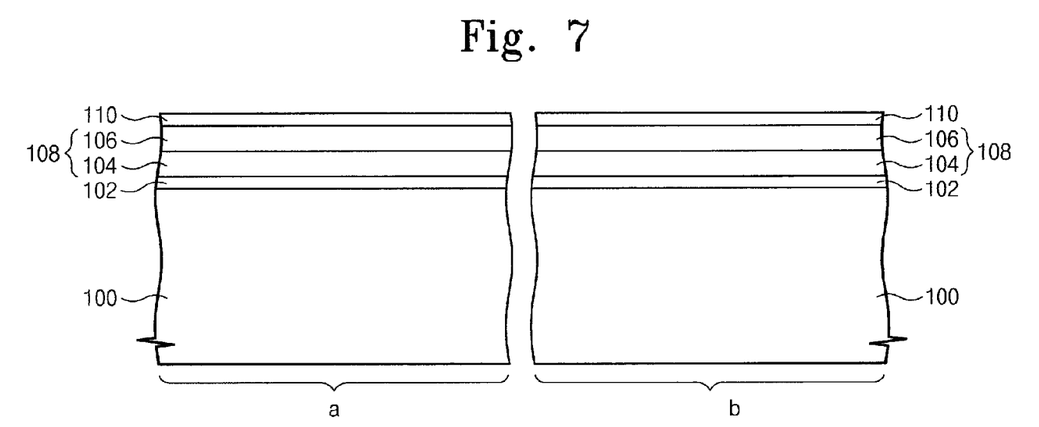
FIGS. 7 through 10 are cross-sectional views illustrating a method of forming a semiconductor device according to another embodiment of the present invention.

Referring to FIG. 7, an interface layer 102 may be formed on a substrate 100 including a first region (a) and a second region (b). A metal oxide layer 108 may be formed on the interface layer 102. Before forming the interface layer 102, a device isolation pattern (not shown) may be formed in the substrate 100 to define a first active portion in the first region (a) and a second active portion in the second region (b). The first and second active portions may be a portion of the substrate 100 surrounded by the device isolation pattern. One of the first region (a) and the second region (b) is a region where a PMOS transistor is formed and the other is a region where a NMOS transistor is formed.

The metal oxide layer 108 may be single-layered or multi-layered. The metal oxide layer 108 may include a first metal oxide layer 104 and a second metal oxide layer 106 that are sequentially stacked. A sacrificial oxide layer 110 is formed on the metal oxide layer 108. The first metal oxide layer 104, the second metal oxide layer 106 and the sacrificial oxide layer 110 may be identical to the first embodiment described above. The sacrificial oxide layer 110 may be formed at a temperature lower than a minimum temperature required when a first metal element, a second metal element and oxygen in the first and second metal oxide layer 104 and 106 are activated.

Figure 8:
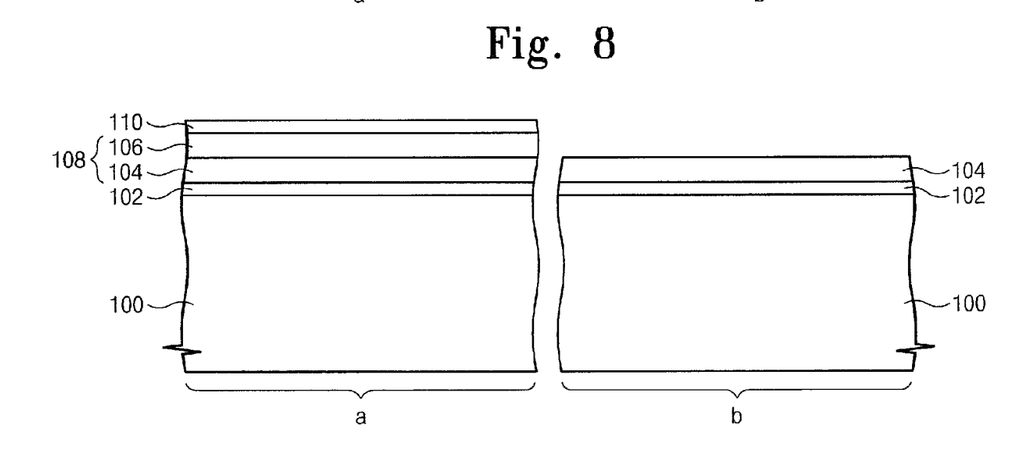

Referring to FIG. 8, the sacrificial oxide layer 110 and the second metal oxide layer in the second region (b) may be removed. At this time, the sacrificial oxide layer 110 and the second metal oxide layer in the first region (a) remain. A mask pattern (not shown) covering the sacrificial oxide layer 110 in the first region (a) may be formed and the sacrificial oxide layer 110 and the second metal oxide layer inn the second region (b) may be removed using the mask pattern as an etching mask. Subsequently, the mask pattern may be removed.

Figure 9:
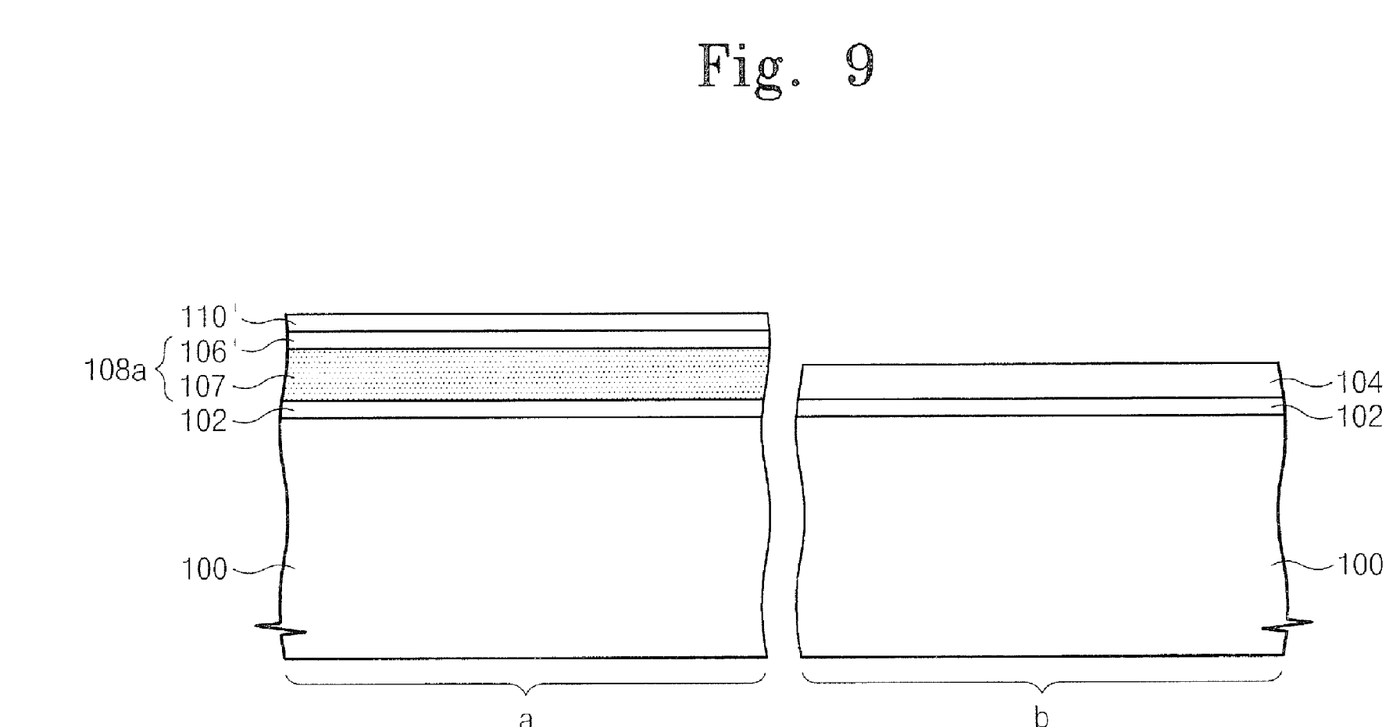

Referring to FIG. 9, an annealing process is performed on the substrate 100. The annealing process may be identical to the annealing process of the first embodiment described above. Accordingly, when the annealing process is performed, the first metal oxide layer 104 and the second metal oxide layer 106 in the first region (a) are combined with each other to form a combination layer 107 and oxygen in the sacrificial oxide layer 110 is supplied to the combination layer 107. As depicted in FIG. 9, a portion of the second metal oxide layer 106 is combined with the first metal oxide layer 104 and the other portion 106' of the second metal oxide layer 106 may remain. Oxygen in the sacrificial oxide layer 110 may be supplied to a remaining layer 106'. Thus, vacancies in an annealed metal oxide layer 108a are minimized. The second metal oxide layer 106 does not exist in the second region (b). Therefore, when the annealing process is performed, the first metal oxide layer 104 in the second region (b) may not be combined.

Figure 10:
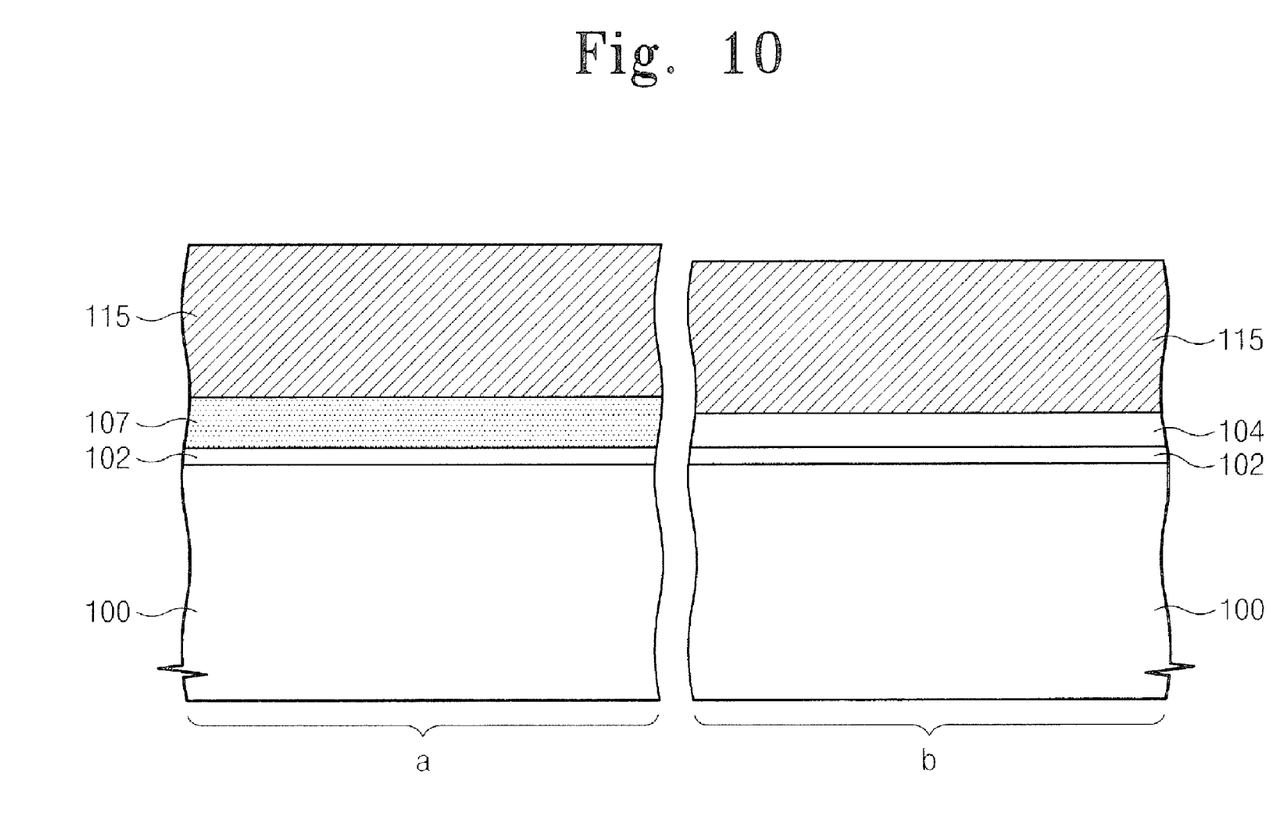

Referring to FIG. 10, an annealed sacrificial oxide layer 110' is removed. As described referring to FIG. 4, after removing the annealed sacrificial oxide layer 110', a portion of the specific element in the sacrificial oxide layer 110 may remain in the annealed metal oxide layer 108a. The remaining layer 106' may be removed according to a characteristic required by a semiconductor device. Unlike this, the remaining layer 106' may remain.

A gate conductive layer 115 is formed on the combination layer 107 in the first region (a) and the first metal oxide layer 104 in the second region (b). The gate conductive layer 115 may include at least one selected from the group consisting of a doped semiconductor, conductive metal nitride (e.g., titanium nitride or tantalum nitride), metal silicide (e.g., tungsten silicide or cobalt silicide) and metal (e.g., titanium, tantalum, copper, aluminum or noble metal).

Figure 11:
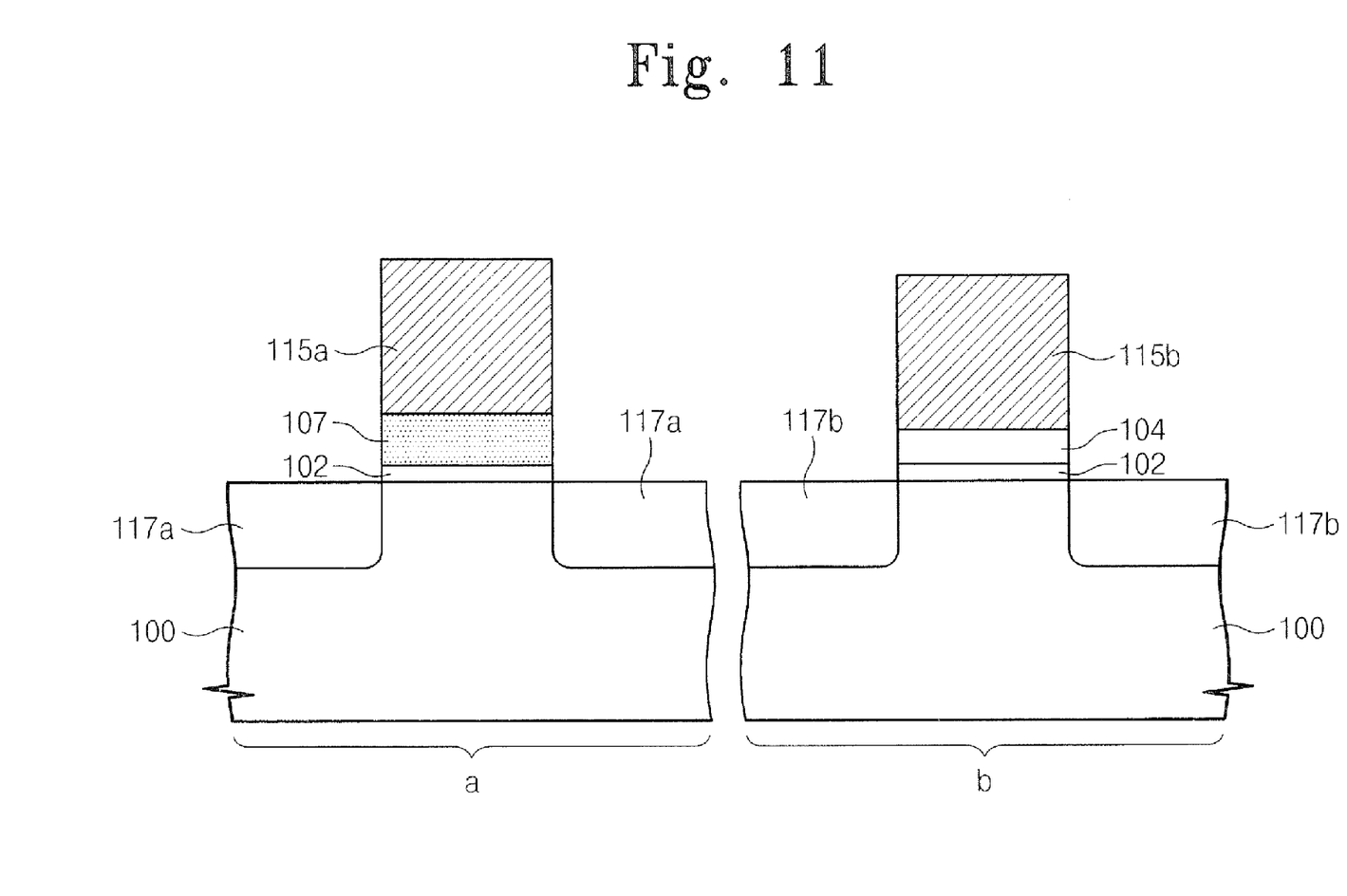
FIG. 11 is a cross-sectional view of a semiconductor device according to another embodiment of the present invention.

The gate conductive layer 115 is patterned to form a first gate electrode 115a and a second gate electrode 115b of FIG. 11. The first gate electrode 115a is formed on the combination layer 107 of the first region (a) and the second gate electrode 115b is formed on the first metal oxide layer 104 of the second region (b). A first source/drain 117a and a second source/drain 117b of FIG. 11 are formed. The first and second sources/drains 117a and 117b may be simultaneously or sequentially formed. The first and second sources/drains 117a and 117b may be doped with dopants of opposite types. That is, one of the first and second sources/drains 117a and 117b may be doped with n type dopants and the other may be doped with p type dopants. The first gate electrode 115a, the combination layer 107 and the first source/drain 117a are included in a first transistor and the second gate electrode 115b, the first metal oxide layer 104 and the second source/drain 117b are included in a second transistor.

According to the method of forming a semiconductor device described above, oxygen in the sacrificial oxide layer 110 of the first region (a) is supplied to the metal oxide layer 108. Thus, quantity of vacancies in the annealed metal oxide layer 108a of the first region (a) are minimized and the first transistor has a superior electrical characteristic.

Also, a Fermi level of the first gate electrode 115a may be shifted by the combination layer 107. Accordingly, even though the first and second gate electrodes 115a and 115b may be formed of the same material, a Fermi level of the first gate electrode 115a may be different from a Fermi level of the second gate electrode 115b. As a result, a CMOS device having a optimized NMOS transistor and a optimized PMOS transistor can be embodied.

For example, when the first gate electrode 115a is adjacent to a Fermi level of n type silicon and the second gate electrode 115b is adjacent to a Fermi level of p type silicon, the first transistor may be a NMOS transistor and the second transistor may be a PMOS transistor. Unlike this, when the first gate electrode 115a is adjacent to a Fermi level of p type silicon and the second gate electrode 115b is adjacent to a Fermi level of n type silicon, the first transistor may be a PMOS transistor and the second transistor may be a NMOS transistor.

FIG. 11 is a cross-sectional view of a semiconductor device according to another embodiment of the present invention.

Referring to FIG. 11, a device isolation pattern (not shown) is disposed in a substrate 100 including a first region (a) and a second region (b) to define a first active portion in the first region (a) and a second active portion in the second region (b). The first and second active portions may be a portion of the substrate 100 surrounded by the device isolation pattern. A first gate electrode 115a crosses over the first active portion and a second gate electrode 115b crosses the second active portion. A combination layer 107 including a first metal element, a second metal element and oxygen is disposed between the first gate electrode 115a and the first active portion. A capping layer (106' of FIG. 9) including a second metal element and oxygen may be disposed between the combination layer 107 and the first gate electrode 115a. A first metal oxide layer 104 including the first metal element and oxygen is disposed between the second gate electrode 115b and the second active portion. An interface layer 102 may be disposed between the combination layer 107 and the first active portion and between the metal oxide layer 104 and the second active portion. A first source/drain 117a may be disposed in the first active portion of both sides of the first gate electrode 115a and a second source/drain 117b may be disposed in the second active portion of both sides of the second gate electrode 115b.

The combination layer 107 or the combination layer 107/capping layer includes a specific element. Reactivity between the specific element and oxygen may be smaller than reactivity between the first metal element and oxygen and between the second metal element and oxygen. A concentration of the specific element in the combination layer 107 may be identical to the concentration described referring to FIG. 5. The first metal oxide layer 140 between the second gate electrode 115b and the second active portion may not include the specific element.

The first and second gate electrodes 115a and 115b may be formed of the same material. A Fermi level of the first gate electrode 115a may be shifted by the combination layer 107. Accordingly, an effective work function of the first gate electrode 115a may become different from an effective work function of the second gate electrode 115b. One of the first and second gate electrodes 115a and 115b may be used as a gate of a NMOS transistor and the other may be used as a gate of a PMOS transistor. Consequently, a NMOS transistor and a PMOS transistor having a superior characteristic can be embodied.

Third Embodiment

The present embodiment discloses a semiconductor device including a capacitor according to an embodiment of the present invention. In the present embodiment, elements identical to the first and second embodiments described above use like reference numerals.

Figure 12:
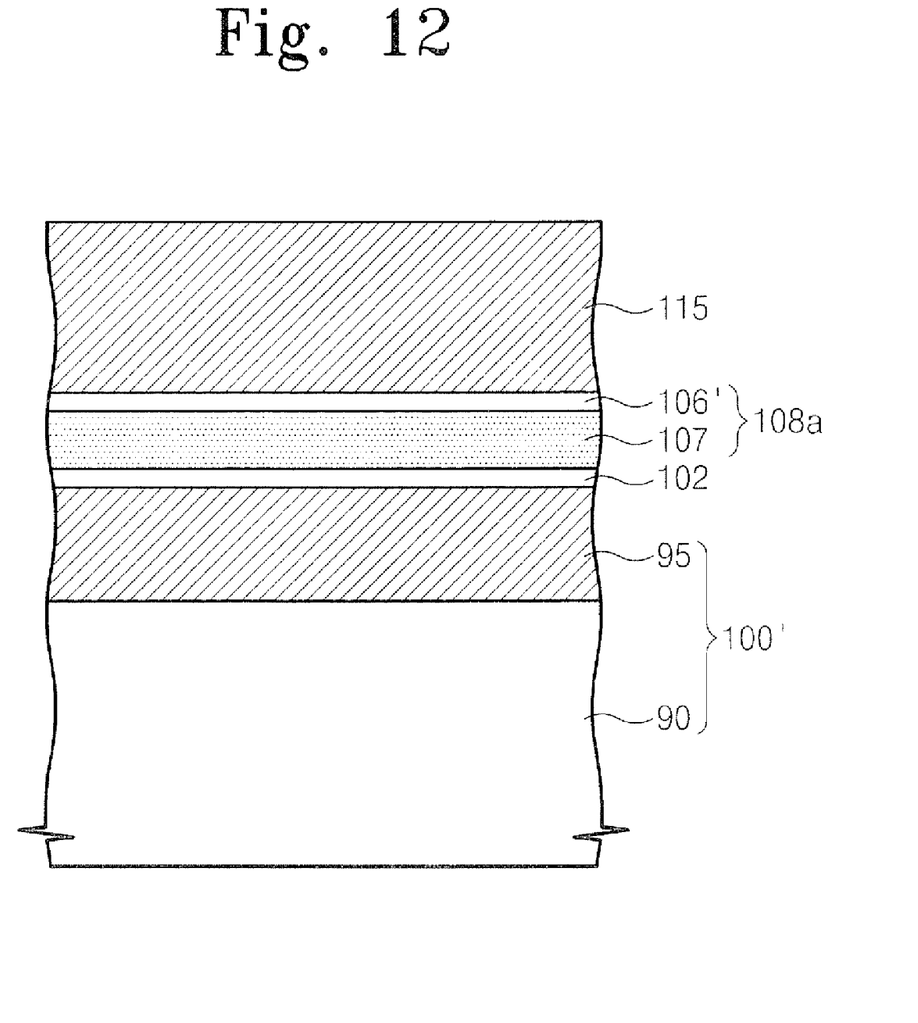
FIG. 12 is a cross-sectional view of a semiconductor device according to still another embodiment of the present invention.

FIG. 12 is a cross-sectional view of a semiconductor device according to still another embodiment of the present invention.

Referring to FIG. 12, a metal oxide layer 108a is disposed on a substrate 100'. The substrate 100' may include a first electrode 95. In addition, the substrate 100' may further include a support substrate 90 under the first electrode 95. That is, the first electrode 95 may be disposed on the support substrate 90. The support substrate 90 may include a semiconductor substrate, or a semiconductor substrate and an insulating layer that are sequentially stacked. The first electrode 95 may include at least one selected from the group consisting of a doped semiconductor, conductive metal nitride (e.g., titanium nitride or tantalum nitride), metal silicide (e.g., tungsten silicide or cobalt silicide) and metal (e.g., titanium, tantalum, copper, aluminum or noble metal).

The metal oxide layer 108a may be disposed on the first electrode 95. An interface layer 102 may be disposed between the metal oxide layer 108a and the first electrode 95. A second electrode 115 may be disposed on the metal oxide layer 108a. The metal oxide layer 108a, or the interface layer 102/the metal oxide layer 108a may be used as a dielectric layer of a capacitor. The first electrode 95 and the second electrode 115 correspond to both electrodes of a capacitor.

The metal oxide layer 108a may include a first metal element, a second metal element and oxygen. In addition, the metal oxide layer 108a may further include a specific element. Reactivity between the specific element and oxygen may be smaller than reactivity between the first element and oxygen and reactivity between the second element and oxygen. The metal oxide layer 108a may include a combination layer 107 and a capping layer 106'. The combination layer 107 may include the first metal element, the second metal element and oxygen and the capping layer 106' may include the second metal element and oxygen. The capping layer 106' may be omitted. A concentration of the specific element in the metal oxide layer 108a may be equal to the concentration described referring to FIG. 5 in the first embodiment described above. As described in the first and second embodiments, the combination layer 107 may shift a work function of the second electrode 115. Thus, a leakage current of a capacitor can be all the more minimized by controlling a difference of a work function between the first and second electrodes 95 and 115.

A capacitor including the first electrode 95, the second electrode 115 and the metal oxide layer 108a may be embodied to have various shapes such as a flat shape, a cylinder shape or a stack shape.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming an integrated circuit device, comprising:
    forming a metal oxide layer comprising first and second different metal oxides, on a substrate;
    forming a sacrificial oxide layer on the metal oxide layer, said sacrificial oxide layer having a Gibbs free energy of formation that is greater than a Gibbs free energy of formation of the first and second metal oxides in the metal oxide layer at a first temperature in a range from about 600° C. to about 1100° C.; and
    annealing the metal oxide layer and the sacrificial oxide layer at the first temperature for a duration sufficient convert at least a portion of the first metal oxide within the metal oxide layer into a combination metal oxide layer comprising the first and second oxides.

2. The method of claim 1, wherein said annealing is followed by the steps of:
    removing at least a portion of the sacrificial oxide layer; and
    forming an electrode on the combination metal oxide layer.

3. A method of forming an integrated circuit device, comprising:
    forming a metal oxide layer comprising first and second different metal oxide layers, on first and second portions of a substrate;
    forming a sacrificial oxide layer on the metal oxide layer, said sacrificial oxide layer having a Gibbs free energy of formation that is greater than a Gibbs free energy of formation of the first and second metal oxides in the metal oxide layer at a first temperature in a range from about 600° C. to about 1100° C.;
    selectively removing the sacrificial oxide layer and the second metal oxide layer from the second portion of the substrate; then
    annealing the substrate and the metal and sacrificial oxide layers thereon at the first temperature for a duration sufficient convert at least a portion of the first metal oxide within the metal oxide layer into a combination metal oxide layer comprising the first and second oxides; then
    removing the sacrificial oxide layer from the first portion of the substrate; and then
    forming a first electrode on a portion of the combination metal oxide layer extending opposite the first portion of the substrate and a second electrode on a portion of the first metal oxide layer extending opposite the second portion of the substrate.

4. A method of forming a semiconductor device, comprising:
    forming a metal oxide layer on a substrate;
    forming a sacrificial oxide layer on the metal oxide layer; and
    performing an annealing process on the substrate including the sacrificial oxide layer, wherein a formation-free energy of the sacrificial oxide layer is greater than a formation-free energy of the metal oxide layer at a process temperature of the annealing process;
    wherein forming the metal oxide layer comprises:
        forming a first metal oxide layer on the substrate; and
        forming a second metal oxide layer on the first metal oxide layer;
    wherein the formation-free energy of the sacrificial oxide layer is greater than a formation-free energy of the first metal oxide layer and a formation-free energy of the second metal oxide layer at the process temperature of the annealing process; and
    wherein the first and second metal oxide layers are combined with each other by the annealing process to form a combination layer.

5. The method of claim 4, after performing the annealing process, further comprising:
    removing the sacrificial oxide layer.

6. The method of claim 4, wherein oxygen in the sacrificial oxide layer is supplied to the metal oxide layer during the annealing process.

7. The method of claim 4, wherein the sacrificial oxide layer comprises a specific element and oxygen, and wherein a portion of the specific element is supplied to the metal oxide layer during the annealing process.

8. The method of claim 4, wherein the sacrificial oxide layer is formed at a temperature lower than a minimum temperature required for an activation of elements in the metal oxide layer.

9. The method of claim 4, before forming the metal oxide layer, further comprising:
    forming an interface layer on the substrate.

10. The method of claim 4, wherein the formation-free energy of the first metal oxide layer and the formation-free energy of the second metal oxide layer are different from each other at the process temperature of the annealing process.

11. The method of claim 4, wherein the first metal oxide layer and a portion of the second metal oxide layer are combined with each other by the annealing process to form the combination layer, and wherein after the annealing process is performed, the other portion of the second metal oxide layer remains on the combination layer.

12. The method of claim 4, further comprising:
    removing the sacrificial oxide layer after performing the annealing process; and
    forming an electrode on the combination layer.

13. The method of claim 4, wherein a Fermi level of the electrode is shifted by the combination layer.

14. The method of claim 4, wherein the substrate comprises a first region and a second region,
    the method further comprising:
        removing the sacrificial oxide layer and the second metal oxide layer in the second region before performing the annealing process;
        removing the sacrificial oxide layer in the first region after performing the annealing process; and forming a first electrode in the first region and a second electrode in the second region.

15. A method of forming an integrated circuit device, comprising:
    forming a metal oxide layer comprising first and second different metal oxides, on a substrate;
    forming a sacrificial oxide layer on the metal oxide layer, said sacrificial oxide layer having a Gibbs free energy of formation that is different than a Gibbs free energy of formation of the first metal oxide at a first temperature in a range from about 600° C. to about 1100° C. and different than a Gibbs free energy of formation of the second metal oxide at the first temperature;
    annealing the metal oxide layer and the sacrificial oxide layer at the first temperature for a duration sufficient convert at least a portion of the first metal oxide within the metal oxide layer into a combination metal oxide layer comprising the first and second oxides; and
    removing the sacrificial oxide layer from the metal oxide layer.

16. The method of claim 15, wherein said annealing is followed by the step of forming an electrode on the combination metal oxide layer.

* * * * *